United States Patent [19]

Blaisdell et al.

[11] Patent Number: 6,041,171
[45] Date of Patent: Mar. 21, 2000

[54] METHOD AND APPARATUS FOR MODELING MATERIAL HANDLING SYSTEMS

[75] Inventors: Dennis R. Blaisdell, W. Bloomfield; Bruce W. Mattison, South Lyon; Robert C. Farthing, Fenton; Michelle A. Sarosy, Troy, all of Mich.

[73] Assignee: Jervis B. Webb Company, Farmington Hills, Mich.

[21] Appl. No.: 08/941,211

[22] Filed: Sep. 30, 1997

Related U.S. Application Data

[60] Provisional application No. 60/055,198, Aug. 11, 1997.

[51] Int. Cl.$^7$ ...................................................... G06F 9/455
[52] U.S. Cl. ........................................................ 395/500.27
[58] Field of Search ......................... 395/500.27, 500.28, 395/500.29, 500.38, 500.41; 74/490.09

[56] References Cited

U.S. PATENT DOCUMENTS

| | | |
|---|---|---|
| 4,512,747 | 4/1985 | Hitchens et al. . |
| 4,604,718 | 8/1986 | Norman et al. ................. 395/500.27 |
| 4,870,591 | 9/1989 | Cicciarelli et al. . |
| 4,928,233 | 5/1990 | Millis . |
| 4,939,668 | 7/1990 | Brown et al. . |
| 4,964,060 | 10/1990 | Hartsog . |
| 4,967,386 | 10/1990 | Maeda et al. ................... 395/500.38 |
| 4,985,855 | 1/1991 | Aldrich et al. . |
| 5,019,992 | 5/1991 | Brown et al. . |
| 5,138,698 | 8/1992 | Aldrich et al. . |
| 5,227,983 | 7/1993 | Cox et al. . |
| 5,247,650 | 9/1993 | Judd et al. ...................... 395/500.41 |
| 5,293,479 | 3/1994 | Quintero et al. . |
| 5,329,464 | 7/1994 | Sumic et al. . |
| 5,504,687 | 4/1996 | Wolf . |
| 5,517,428 | 5/1996 | Williams . |
| 5,557,537 | 9/1996 | Normann et al. . |
| 5,574,841 | 11/1996 | Thompson et al. . |
| 5,799,543 | 9/1998 | Nagai et al. .................... 74/490.09 |

OTHER PUBLICATIONS

Tracey, "Facility and Equipment Engineering Quality Assurance Through CAD—A Case History," *Proceedings of the SAE/ESD International Computer Graphics Conference*, Apr. 1987, pp. 53–62.

Primary Examiner—Kevin J. Teska
Assistant Examiner—Dan Fiul
Attorney, Agent, or Firm—Dickinson Wright PLLC

[57] ABSTRACT

A method and apparatus for modeling material handling systems for carrying discrete objects is disclosed which is capable of displaying models of a system in two, three, or four dimensions. The system is based on an existing program for modeling fluid flow networks, such as the piping design module of the CATIA CCPlant design package. All of the changes to pipe design program are made using tools present in that program, and no computer code needs to be modified.

50 Claims, 5 Drawing Sheets

METHOD AND APPARATUS FOR MODELING MATERIAL HANDLING SYSTEMS

This application is a continuation of provisional application Ser. No. 60/055,198 filed Aug. 11, 1997.

The present application is directed to a method and apparatus for multiple dimensional modeling, and more specifically toward a method and apparatus for the multiple dimensional modeling of material handling systems.

BACKGROUND OF THE INVENTION

There is presently available computer modeling software that allows a person to create three dimensional representations of various objects and systems on a computer screen. These objects, or portions thereof, can be easily changed using this software and new features can be added. Many programs allow the size of an object to be modified to show various amounts of detail. It is also possible using such programs to manipulate an object and view it from a variety of perspectives. The modeling and manipulation of three dimensional images requires a significant amount of processing power, especially when the objects are complex. The cost of using such systems, therefore, has generally prevented all but the largest companies from taking advantage of these systems. However, as the price of powerful computers falls, and as new algorithms become available which can simplify the display of three dimensional objects, more and more industries are discovering the advantages of such three dimensional modeling systems.

One such modeling program is called CATIA and was developed by the French company Dassault Systemes. This program is distributed in the United States by IBM. CATIA performs the above functions and many others and also includes specialized add-on programs or modules that allow the program to be used to design specific types of products and systems. For example, CATIA includes modules for laying out piping systems in buildings, designing ship hulls, and for designing HVAC systems. Different modules can be used depending on the needs of the designer, and different groups of modules may be bundled together when it is believed that certain designers will have a need for several different modules for a single design project. One such bundle of modules is known as CCPlant and includes various applications, such as a piping module and an HVAC module, that are useful when designing manufacturing plants.

In addition to HVAC and piping systems, almost all modern manufacturing plants include material handling systems. These systems are used for moving raw materials to processing points and for moving a partially formed product from one station to another on an assembly line. A conveyor is the material handling system of choice for many of these applications. Other types of businesses also use material handling systems which may or may not include conveyors. For example, a warehouse must be equipped with some system, whether manual or automatic, for storing and retrieving items. This system may comprise automatic vehicles which place and retrieve items, or a system of conveyors for moving items to and from designated locations. Airports use similar systems to move baggage between ticket counters and airplanes and from airplanes to baggage carousels and other airplanes.

When designing a material handling system, the environment in which the system will operate must be taken into account. For example, the system must convey material from one point to another while avoiding structural components of the building, ductwork, electrical systems, pipes, etc. CATIA includes modules for laying out networks of pipe and for designing the structural components of a building. However, neither CATIA nor any other known three dimensional modeling program includes a module to assist a user in the design and layout of a material handling system. It would therefore be desirable to provide a three dimensional modeling device for designing a material handling system and a method of using same that would allow a user to visualize the layout of such a system, either by itself or together with the other systems of a building.

SUMMARY OF THE INVENTION

The present invention addresses these and other problems by providing a method and apparatus for producing a model of a material handling system in two, three, or four dimensions. Because the creation of a three dimensional model is often the first step in modeling a material handling system, the present invention will often be described herein as a three dimensional modeling system, it being understood that two dimensional representations and four dimensional simulations are also possible using this system. Moreover while this invention can be used to model any material handling system, such as conveyor systems, newspaper handling systems, baggage handling systems, automated storage and retrieval systems, and others, for the sake of simplicity, the material handling system will often be referred to hereinafter as a conveyor system. (Many of these other systems will include conveyors as components thereof, and in addition, include various other storage and handling devices, such as gripper and lap stream conveyors, storage racks for newspapers and devices for baggage transfer and devices for moving objects onto and removing them from conveyors.) The invention allows a designer to create a three dimensional model of various conveyor systems, to modify the elements which comprise the system, and to display the system either alone or together with various other elements of the environment in which the conveyor system will be used.

In a preferred embodiment, the invention comprises a modification of an existing program for modeling pipe networks, such as the 3D Piping Design module of CATIA. Other programs for modeling other fluid handling systems, such as HVAC or electrical systems could also be used. The CATIA piping module itself cannot be used to model a material handling system because of the many differences between pipes and conveyors. For example, pipes carry a flow of a homogeneous fluid while conveyors must transport multiple, discrete, solid objects. It is necessary to keep the objects on a conveyor line separate, to add and remove them from the carrying mechanism, and to control the order in which they travel and the spacing between the objects. None of these concerns are present when designing a pipe layout. Therefore, while the need for a three dimensional model of a material handling system has been recognized, it has heretofore not been possible to create such a system. However the present inventors have discovered that, despite the striking differences, enough similarities exist between the two types of system to allow a system for modeling a material handling system to be developed from a system for modeling pipes.

The CATIA 3D Piping Design module is particularly amenable to such modification due to a number of tools built into CATIA which allow the program to be customized for the needs of a given user. For example, the names of the pipe elements can be altered, and new descriptions of pipes and connectors can be added to a catalog of pipe parts. Furthermore, CATIA is built on object technology. This means that elements created by the piping or other modules have properties, can perform certain actions, and can be controlled through manipulation of the properties and actions. CATIA allows for the modification and creation of objects, which is very useful for the reasons described in greater detail hereinafter. Beneficially, all of these modifications can be made without altering or even having access to the source code of the CATIA program or piping module.

In a second embodiment of the present invention, information about material handling systems and their components is embedded in the system along with a series of rules for how the elements of the system can interact. For example, rules may be included in a model of a conveyor system to ensure that a stop is always placed at the end of certain sections of track or that a certain spacing is always maintained between a given pair of elements. By providing detailed information about each conveyor system element, a wide variety of analyses can be performed on the elements and the overall system to locate design errors quickly while they are still easy and inexpensive to correct. The inclusion of these rules in the system also makes it more difficult to connect conveyor elements improperly in the first place. When the model also includes information about the environment in which the system operates, rules can be used to analyze relationships between the conveyor and any other building systems such as the HVAC system and the building's structural supports.

In a third embodiment of the present invention, macros are added to the system to extract other types of information therefrom. These macros can analyze a conveyor system, for example, and determine the system's power requirements, calculate the cost of the system, or calculate the production capacity for a single conveyor or the entire conveyor installation. These macros can perform other functions as well. For example, each time a section of track is placed, macros can be run to automatically add appropriate supports and connect them to the building that houses the conveyor.

In a fourth embodiment, a separate material handling object is defined as a subset of the piping object. This is allowed by CATIA and does not require access to software code. While the three dimensional modeling of material handling systems can be accomplished by making changes to the piping object, the creation of a separate material handling object within the piping object allows the precise definition of categories specific to material handling. This is necessary when the separation of material handling components from piping components is desired.

It is therefore the principal object of the present invention to provide a method and apparatus for modeling material handling systems.

It is another object of the present invention to provide a method for adapting a three dimensional modeling program so that it can be used to model material handling systems.

It is still another object of the present invention to provide a method for adapting a three dimensional pipe network modeling program so that it can be used to model material handling systems.

It is yet another object of the present invention to provide a material handling object within a three dimensional pipe network modeling program which can be used by that program.

It is a further object of the present invention to provide a method for adapting the 3D Piping Design module of the CATIA modeling program so that it can be used to model material handling systems.

It is another object of the present invention to provide a material handling object within the piping object of the CATIA piping design module.

It is still a further object of the present invention to provide a method and apparatus for modeling a material handling system in three dimensions that helps to ensure the proper connection and interaction of the various elements of the material handling system.

It is yet a further object of the present invention to provide a method and apparatus for modeling a material handling system in three dimensions that includes at least one embedded set of rules for ensuring the selection of appropriate system elements.

It is another object of the present invention to provide a method and apparatus for modeling a material handling system in three dimensions that includes at least one embedded set of rules for ensuring the selection of appropriate system elements wherein the set of rules to be applied is determined based on the specification of the type of system being designed.

It is yet another object of the present invention to provide a method and apparatus for modeling a material handling system in three dimensions together with a representation of at least part of the environment in which the material handling system will operate.

It is another object of the present invention to provide a method and apparatus for modeling a material handling system in three dimensions that includes a representation of at least part of the environment in which the material handling system will operate and which analyzes relationships between the material handling system and parts of the environment included in the model.

BRIEF DESCRIPTION OF THE DRAWINGS

These and other objects of the present invention will become apparent from a reading and understanding of the following detailed description of several preferred embodiments of the invention together with the following drawings of which.

DETAILED DESCRIPTION OF THE PREFERRED EMBODIMENTS

The preferred embodiment of the subject invention comprises a modification to the 3D Piping Design module of the CATIA CCPlant software package developed by Dassault Systemes and distributed in the United States by IBM. This package enables a user to produce a three dimensional representation of a piping network and add elements to the network through a menu-driven system which facilitates the selection of appropriate elements. This speeds the design phase of a project by eliminating the need to look up a part number for each part as it is entered in the system and allows a designer to see the system in three dimensions as it is constructed.

When using the program, a user is first asked to select a "Standard" which describes the overall piping network. For example, this standard may be "galvanized pipe." The user is also required to enter a catalog number to identify which part catalog from the chosen standard will be used. Next the user identifies a "Line ID." Piping networks consist of a number of distinct lines connected by valves or other devices. The "line ID" identifies a particular one of these lines that the user wishes to modify. Then the user provides certain parameters for a piping system element, its internal and external diameter, for example. When the standard and line are identified, and the two parameters have been entered, the user is presented with a list categories of parts that can be added to the line. For example, the user can identify a point on a certain line and select the category "elbow" to indicate that an elbow should be inserted at that point. Once these selections are made, the program presents the user with a list of elbows having the required characteristics. These elbows may have different lengths or radiuses, and the user selects the desired elbow, an elbow with a 45° bend for example. If after this selection is made, there is still more than one part that has all of the desired characteristics, the user is presented with a short list of part numbers of the parts having all of the necessary characteristics, and the user selects the particular part that is to be inserted in the line. CATIA then generates a representation of the pipe network which includes a representation of the element that was just selected.

In order to modify this program so that it can be used to design and model a material handling system, a catalog of material handling system elements must be created and made available to the program. These elements must then be arranged in a hierarchical structure that corresponds to the structure of the piping element catalogue of CATIA so that CATIA can operate on these elements. This process is complicated by the fact that certain features of the piping module, such as "branch table," and "insulation" have no logical correlation to material handling systems. For this reason as well as others, the structure of this module does not appear to be suited for use with a material handling system. However the inventors herein have discovered that certain of these categories can be ignored or deleted without adversely affecting the performance of the module. Appropriate modifications can be made to the other categories to make them relevant to material handling systems. The resulting hierarchy is then used by CATIA and the piping module to design a material handling system.

A separate catalog is created for each material handling system standard such as "Conveyors," "Automatic Guided Vehicles," etc. To enter a part in the catalog, a name for the part is selected, and a representation of the part is constructed using AEC Primitives, a tool that allows a user to create a large number of three dimensional shapes from a small set of predefined geometric shapes that can be modified, joined, and scaled. Next, the PIPSETUP function of CATIA is used to define the characteristics of the new part, such as in which catalog the part is to be located, the part category into which the part falls, first and second parameterized attributes such as drop and length for a straight section of track, or drop and radius for a curved section of track, a part type, and a part number which uniquely identifies that part. For example, an entry might be made in the "Conveyor" catalog by defining a part called "Part1." This part would have the characteristics of being 1) enclosed, 2) part of a power and free system, 3) straight track, 4) having part number xxxx, and 5) being characterized by a drop and a length. Connectors are included in the description of the part which will allow the part to be connected to other parts in the system. The part will also be included in one or more "specifications," and the nature and use of these specifications will be described in detail hereinafter.

The next step in this modification process is to rename the CATIA menu entries so that they refer to material handling system elements rather than piping elements. This is accomplished using CATIA's National Language Support (NLS) feature which allows a user to modify names of the various menu entries. This tool is normally used to create menus in non-English languages, but has been found to work equally well for changing the English language descriptions used in the menus. First, a customization file is generated using the CATIA utility CATGNLS. The names of the various objects are then changed using this utility. For example, the entry "Standard" can be changed to "Material Handling System," and the entry "Line ID" to "Conveyor ID." Other entries can also be modified as necessary. Then, using the CATRNLS utility, the CATIA Project Registration file is updated to include this new catalog information. Next, the menu items in a declaration file (such as CATCMD.dcls) must be updated using meta-function declaration variables. For example, the menu item "Line ID" can be changed to "Conveyor ID" in this manner. After the declaration file is updated, the CATIA session must be terminated and a new session started in order for these changes to take affect. Details concerning the steps involved in renaming these files can be found in various CATIA reference materials, such as the Administrator's Guide, IBM Document Number SH52-1115-20, and will not be addressed further herein. With these changes in place, a user will be presented with menu choices appropriate to material handling systems rather than piping networks. These menus will help a user to select appropriate material handling system elements from the newly created catalogs. The existing piping catalogs cannot be used for this purpose because there are too many differences between pipes and material handling systems.

Figure 1:
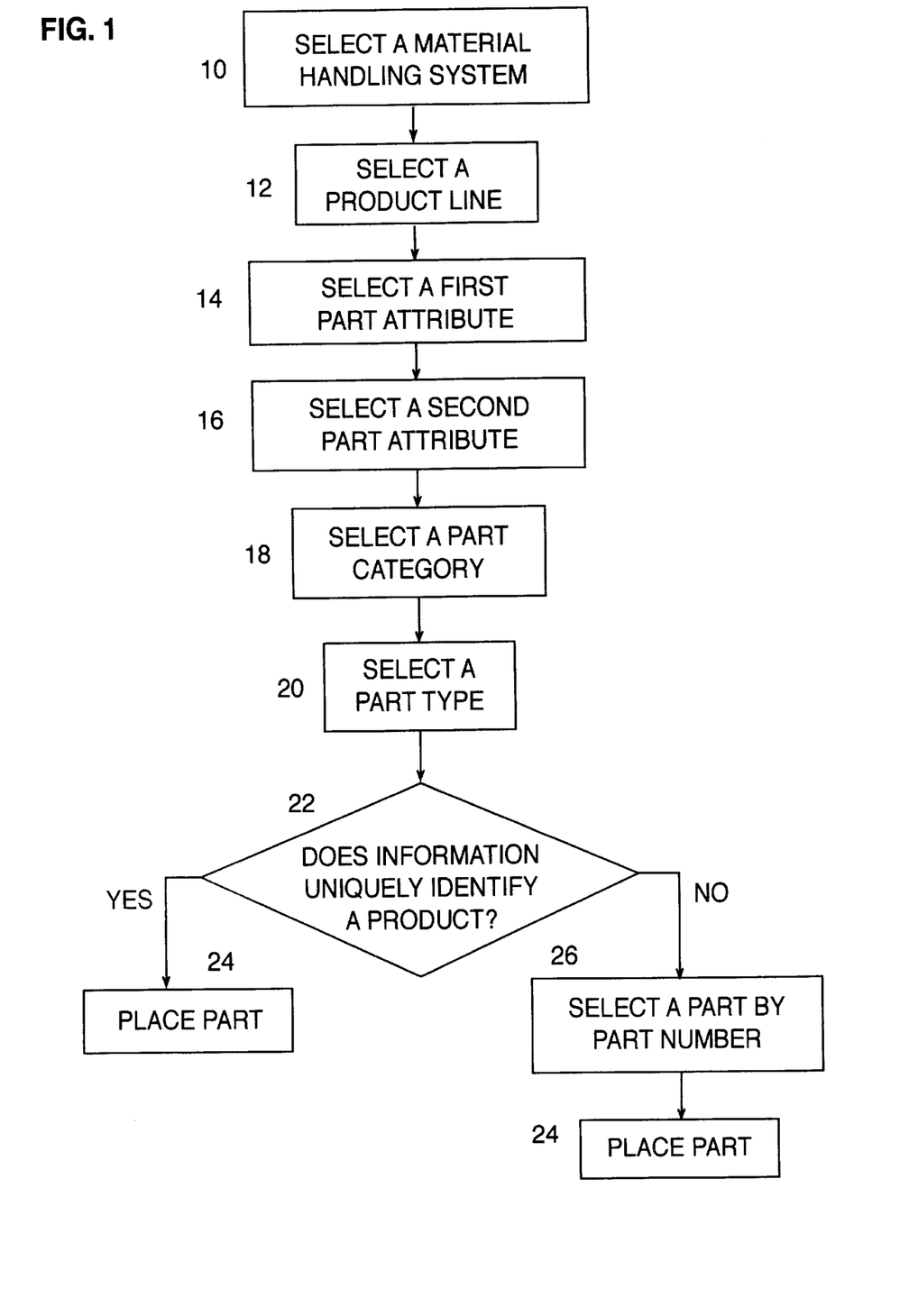
FIG. 1 is a flow chart showing the steps involved in selecting an element for a material handling system.
Figure 2:
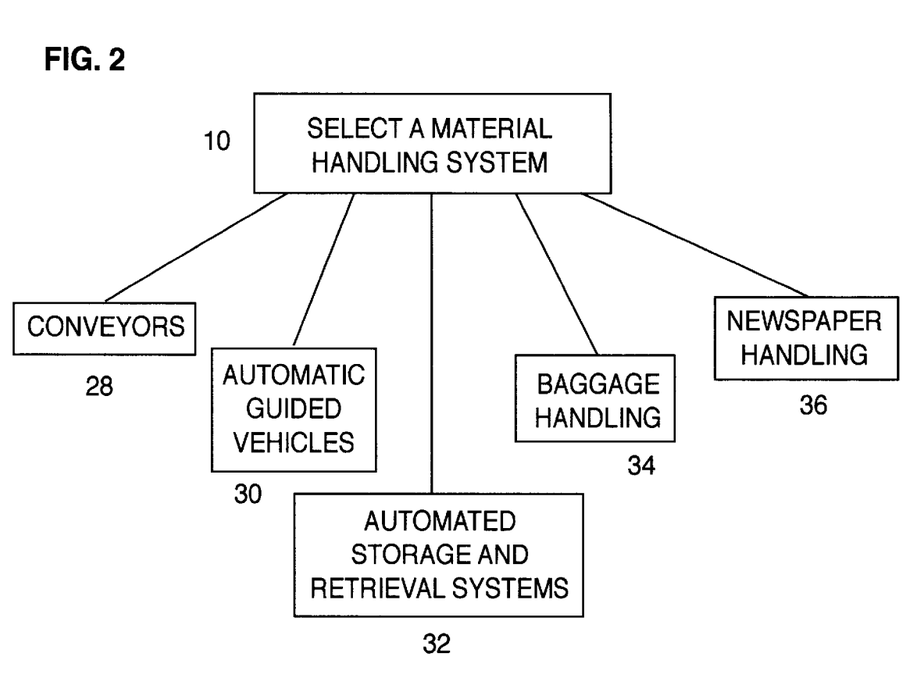
FIG. 2 is a flow chart showing the various material handling systems that can be selected as a first step in using subject invention.

As can be appreciated from the above description, material handling systems cannot be characterized in the same manner as pipe or ductwork or any of the other systems for which CATIA modules exist. It does not appear that any of the CATIA modules are suitable for use with material handling systems. It therefore required considerable insight to determine that the above modifications could be made and to make these modifications in a manner which allowed the existing piping module to model material handling systems. Once a catalog of parts has been created, the system is ready to model a material handling system in three dimensions A designer can use the menu selection system and catalogs described above to form a three dimensional representation of a material handling system comprising a number of discreet elements. The overall logic of the design process is outlined in FIG. 1. This logic applies to all material handling systems, and because such systems generally include conveyors or similar elements, much of this discussion will focus on the modeling of conveyors. The main difference between conveyors and the other material handling systems is that those systems include additional elements to be modeled which elements will function in conjunction with conveyors or conveyor-like devices FIG. 1 provides an outline of how the system of the present invention is used. A user is given a prompt 10 to select the type of material handling system that he wishes to model and then prompted to select a product line 12 that is included in the chosen material handling system. The user decides on a category of part that is to be added to the system and identifies a value for a first parameter 14 and a second parameter 16. The parameters are specific to a given part category. For example, the parameters "drop" and "length" describe the category "straight track." Once the values have been entered, the user enters the name of the part category 18 that was previously decided upon. Because the nature of the parameters depends on the nature of the part category, the user must have a part category in mind before entering values for the parameters. However, the architecture of the CATIA piping module does not allow the part category 18 to be entered into the system until values for parameters 14 and 16 have been entered. The user can next select a part type 20 which is a subset of the part category 18. The system performs a check 22 at this point to determine whether the identified criteria are sufficient to identify a unique part. If they are, a representation of the part is displayed using routine 24. If they are not, the user is presented with a short list 26 of the part numbers of all parts that satisfy the criteria selected thus far, and once the desired part is identified, it is displayed. Without this system, each part would have to be selected individually by part number, a time consuming practice, and one in which errors are likely to occur. With this system, the user is only presented with proper options for part selection and this greatly reduces the likelihood that an improper part will be selected.

Once a part has been selected and displayed, the user can select another part category 18 and make additional choices to define a second element of the system. When this second element is identified, it is attached to the first part at a location specified by the user and connected to the earlier part using the connectors that are included in the definition of each part. This process continues until the entire material handling system has been constructed and displayed. The system also allows for modifications to the system—the user can delete parts from the system and use the menu system as described above to insert new parts.

Figure 3:
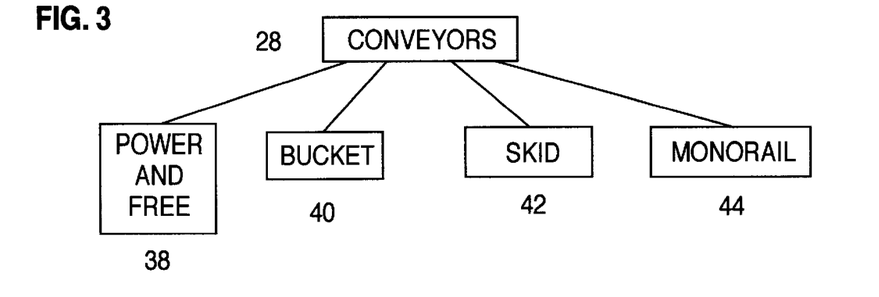
FIG. 3 is an expansion of one of the elements of the flow chart in FIG. 2.
Figure 4:
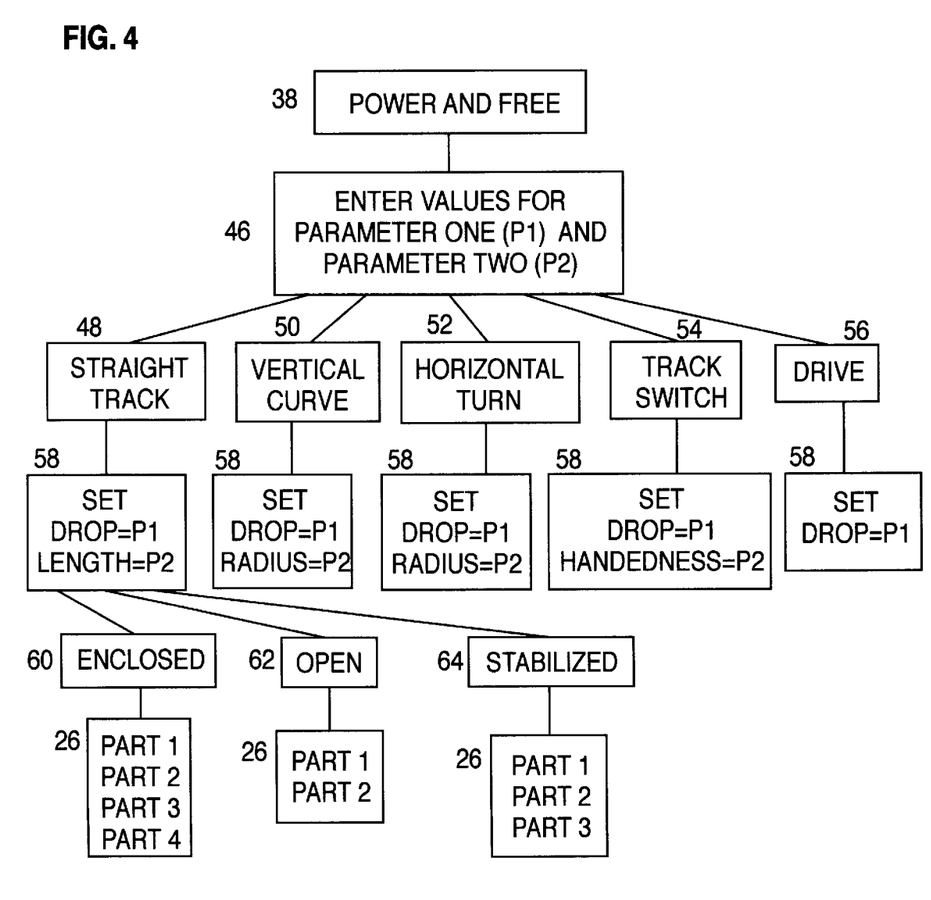
FIG. 4 is an expansion of one of the elements of the flow chart in FIG. 3.

FIGS. 2–5 show in greater detail the selection process outlined above. At prompt 10, the user is invited to select from among several different material handling systems, such as conveyors 28, automatic guided vehicle systems 30, automated storage and retrieval systems 32, baggage handling systems 34, and newspaper handling systems 36. The system is flexible and other material handling systems can be added as desired by creating and naming new catalogs of parts. For purposes of discussion, it will be assumed that the user selects system 28, conveyors, from this menu. When system 28 is selected, the user is presented with another series of choices as shown in FIG. 3. These choices identify a number of different conveyor product lines including power and free 38, bucket 40, skid 42, and monorail 44. FIG. 4 shows that the user has selected product line 38, power and free conveyors. At this time, the user decides what part type he wishes to select and is prompted at step 46 to enter values P1 and P2 for two parameters which describe that part type. Once these values are entered, the user is given a number of part categories to choose from, namely straight track 48, vertical curve 50, horizontal turn 52, track switch 54 and drive 56. Each of these part types is defined by one or two parameters. The values P1 and P2 are assigned to these parameters at step 58. For example, if the user selects the part category straight track, the values P1 and P2 are assigned to the parameters drop and length. If a vertical curve is selected, the values P1 and P2 are assigned to the parameters drop and radius respectively. Parameterizing the parts in this manner avoids the need to define a separate part type for every different length of straight track, for example. Only one general straight track element need be defined, and it can be assigned a length and a drop with the parameters. In addition, other product lines and part categories can be added.

The user has selected a section of straight track having a drop of P1 and a length of P2 and now must identify a part type under the selected part category. For example, there are several types of straight track and the user is prompted to select from among enclosed track 60, open track 62, and stabilized track 64. Assume that the user selects the category "straight track." If there were only one type of enclosed, power and free straight track, this element would be displayed on the display device. Since there is more than one part that satisfies all of the selected criteria, the user is presented with a list 26 of part numbers to allow the final selection to be made. The user selects a part by number and the part is displayed on the screen using routine 21. Whereas without this system, a user might have had to select from among thousands of part number to specify a particular part, with the above menu driven system, the user's choices are narrowed significantly down to one or a few options.

In a second embodiment of the present invention, rules are added to the system to perform checks as each part is added. These rules may check to ensure that a given conveyor line has only one drive for example, and cause the system to alert a user who attempts to insert a second drive. The rules can also check to make sure that stops are always present at certain locations for safety reasons, or that the radius specified for a given curve is appropriate for a given conveyor system. The rules operate on a data set comprised of all of the parts in the system and all of the characteristics of each part as defined in the catalog. If necessary, characteristics can be added to each part definition to allow the creation of even more complex rules. This flexibility allows rules to be written to check for virtually any problem that could arise during the assembly of a material handling system, and allows new information to be added as the source of and solutions for other problems are found.

In a third embodiment, various macros are provided for performing network analysis on the various pipe networks. Some of these macros are similar to those used for analyzing piping networks. Because piping and material handling systems comprise networks of connected elements, such macros can be used to perform similar analyses on material handling system networks. This is true even though a network for transporting fluids is quite different from a network for transporting discrete solid objects. Thus, it is possible to use these functions of CATIA to determine the number and types of different elements in a specified network. It is also possible to determine the order of these elements in a network and different relationships between elements, such as whether one object is upstream or downstream from another. This feature is sufficiently abstract that it can be used in both the material handling and piping models. Because of the level of detail included with each object, other macros can easily be written to perform a wide variety of functions.

Other macros can also be written to perform repetitive tasks associated with the layout of a material handling system. For example, a macro can be used to add appropriate supports to each element as it is placed in the system. Other macros can be used to add multiple segments of track, for example, five 10 foot sections of the same track could be added with a macro rather than by selecting the part from a menu five separate times. Because the system supports this use of macros, almost any series of operations that can be carried out using the system can be automated through the use of macros.

With a three dimensional display system configured in this manner, it also becomes possible to automate the extraction of many types of information from the model. For example, once the system is in its desired form, the production capacity of the system can be calculated by executing an appropriate macro. Other macros can be written to calculate the horsepower needed for a particular drive given the configuration of the conveyor track. The execution of these macros is possible because of the amount of detail concerning each system element that is embedded in the system. In addition, CATIA includes built-in functions to create two dimensional details of various parts of the system for use during fabrication, and CATIA four dimensional viewers can be used to view the operation of the material handling system modeled as described above.

Figure 5:
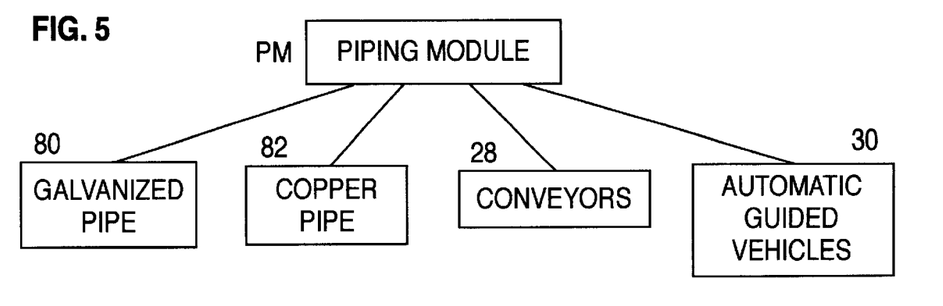
FIG. 5 is a chart showing the relationship between piping objects and material handling objects in a first embodiment of the present invention.
Figure 6:
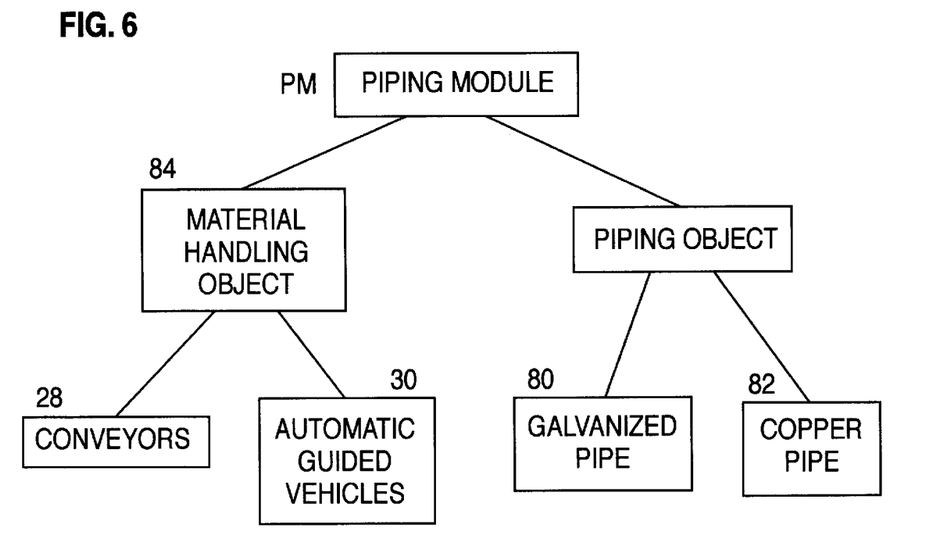
FIG. 6 is a chart showing the relationship between piping objects and material handling objects in a different embodiment of the subject invention; and, FIG. 7 is flow chart showing the options available to a user when a piping specification is used in connection with the subject invention.

In the first embodiment, each of the individual material handling systems was defined as a separate object under the piping module PM. This is shown in FIG. 5 wherein piping objects such as galvanized pipe 80 and copper pipe 82 are present on the same level of the hierarchy as conveyors 28 and automatic guided vehicle systems 30. In a fourth embodiment, as shown in FIG. 6, a general material handling object 84 is created in the piping module PM, and the individual material handling system objects 28, 30, 32, and 34, are included as subsets of this general object 84. By creating this separate object, the piping functions and material handling functions of the system can be readily segregated to allow the system to operate as a material handling design system and to make the former piping functions of the system less apparent to a user.

The piping module also includes a function called "Pipe Spec." that allows a piping specification, such as an ANSI standard, to be identified. The requirements of the specification determine the particular types of pipes and pipe fittings that can be used in a given project. For example, a certain ANSI standard may require that all pipes used have a certain pressure rating. Once this standard is identified in the pipe specification, the only menu options presented to the user will be for pipe elements that comply with this standard. The pipe specification feature can be renamed "Conveyor Specification" and used in a material handling setting, although here instead of identifying an ANSI standard a specific conveyor standard is identified by a code. based on the nature of the parts included in a particular catalog. To create a specification, the items in the catalog must be grouped according to the applications for which they are best suited. The specification is then defined so that a user is forced to select an item included within one of these groups when laying out a system. Once this system is identified, the only options presented to the user in the menu system will be parts that are included in the specification. When such a "Conveyor Specification" is not entered, a user may be left with a number of parts to choose from, all of which satisfy the criteria selected from the menu. When working with a conveyor specification, however, it is likely that there will be only one part that satisfies the menu criteria, and this will be the correct part to use.

Figure 7:
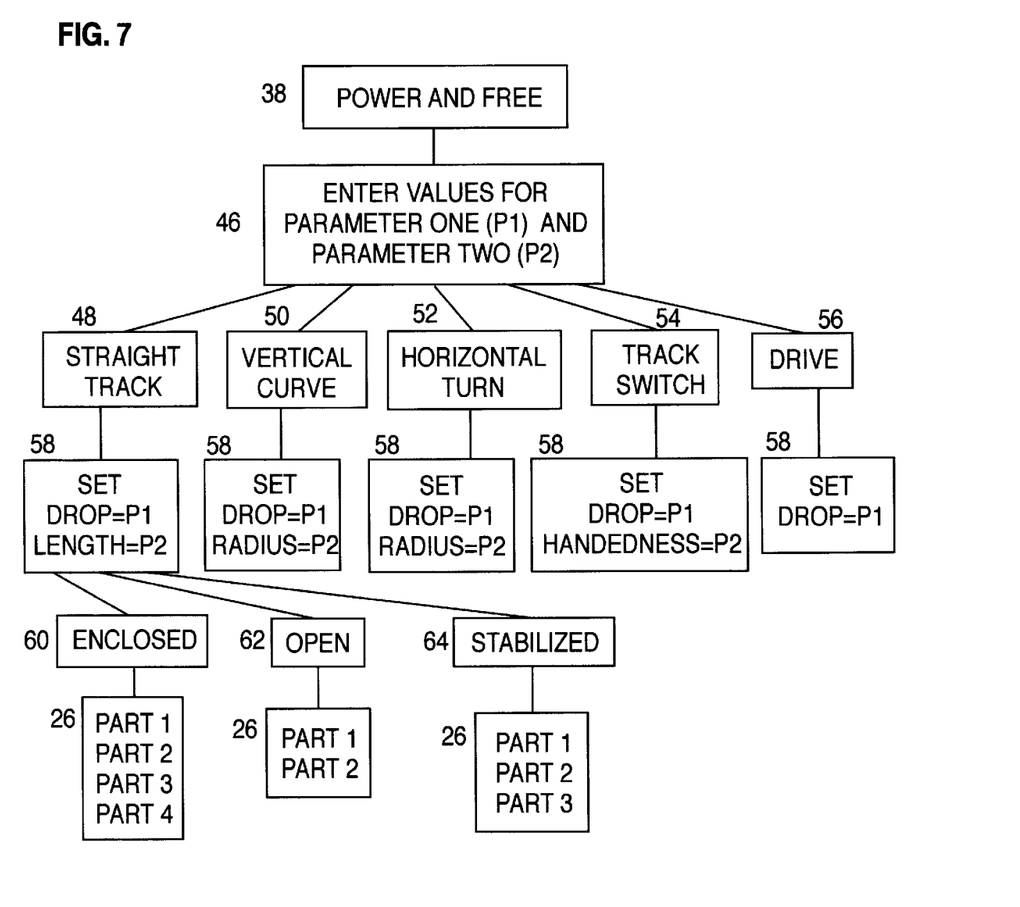

FIG. 7 shows the operation of the subject program under the control of a conveyor specification. Only the options shown in solid lines are available for selection by a user. The options shown in dashed lines are included for illustration purposes, but would not be seen by a user. Thus while a user may have had the option of selecting from among four types of enclosed track 60, two types of open track 62, and three types of stabilized track 64, when no specification is used, the specification allows a choice of only two type types of enclosed track 60, no types of open track 62, and one type of stabilized track 64. A user selecting the part type enclosed track 60 under this specification will be presented with only two part numbers to chose between. A user selecting the part type stabilized track 64 will have only one choice. The specification can be defined in any manner, depending on which choices the person setting up the system wishes to make available to a designer.

The use of specifications further simplifies the selection of proper parts. Sometimes, however, it will be desirable to insert a component that is not included in a given specification. The piping design module of CATIA provides a method for doing this with piping. After the modifications to the piping module described above have been made, this feature of CATIA can also be used to insert a non-spec part into a material handling system. The user merely uses the "Non-Spec Parts" option, and this allows the user to either directly input the part number of the part he wishes to insert, or work through a hierarchy of menus which are not restricted by the specification. Once the desired part is identified in either of these two ways, it can be inserted into the system like any other part.

As described above, a variety of rules can be embedded in the system to ensure that system elements are assembled in a proper manner and that, for example, stops are included in all locations where they are needed. Beneficially, these rules can be made specific to a given conveyor specification. Thus, for example, when the conveyor specification identifies an overhead power and free conveyor a first set of rules would apply, and a different set of rules would apply when an inverted power and free system is specified. This allows highly detailed rules to be embedded in the system even though not all the rules apply to all systems.

When the specific part is selected, a representation of the part is displayed on a computer screen. The representation is constructed from light primitives, basic shapes such as circles and squares, that can be scaled and combined to make more complex shapes including the shapes of the elements of material handling systems and other aspects of an environment in which the material handling system will be used. Construction of such shapes using CATIA software is well known and does not form a part of the present invention. However, in the present invention, logical connectors are incorporated into the description of the shapes to allow them to be connected to other conveyor elements.

When a detailed depiction of the material handling system is not needed, the program is also capable of displaying the conveyor as a single line, or producing a volumetric display in which the conveyor elements are represented by the volumes that they occupy.

Elements of a material handling system can also be displayed in conjunction with a model of the environment in which the system is to operate. For example, the above-described power and free conveyor could be installed within a model of a manufacturing plant that showed all of the walls and supports in the building. This allows the person designing the conveyor to route the conveyor elements around walls and beams and to see immediately if there will be a conflict between the intended conveyor design and the elements of the environment surrounding the conveyor. When additional environmental elements are included in the model, such as HVAC ductwork or electrical conduit, it is possible to configure a conveyor to fit within the available space. The concurrent display of all of these systems also makes it easier for the designers of these various systems to work together to ensure that all of the systems are arranged in a satisfactory manner.

The subject invention has been described herein in terms of several preferred embodiments. Many obvious additions and modifications to these embodiments will become apparent to a skilled practitioner upon a reading and understanding of this disclosure. For example, the invention is not limited to a modification of piping design programs but could comprise a modification of a program for modeling another fluid, such as air, as well. All of these modifications and additions are included within the scope of this patent to the extent that they are covered by the claims appended hereto.

We claim:

1. A method for modeling a material handling system in three dimensions comprising the steps of:

providing at least one memory means;

storing in digital form in said at least one memory means a set of instructions for designing and displaying a model of a fluid flow network comprising a plurality of fluid flow elements;

storing in digital form in said at least one memory means a catalog of material handling system elements and rules for connecting said elements;

providing a computer operatively connected to said at least one memory means;

selecting a first material handling system element from said catalog;

selecting a second material handling system element from said catalog;

entering data into said computer including the identity of said first and second selected elements;

executing said set of instructions on said data to display said first and second selected elements connected in accordance with said rules.

2. The method of claim 1 wherein the elements in said catalog are arranged in a hierarchy.

3. The method of claim 2 wherein each of said elements in said catalog is defined in terms of a number of characteristics.

4. The method of claim 3 wherein the step of selecting a first element comprises the step of prompting a user to identify characteristics of said first element.

5. The method of claim 4 wherein each of said elements is uniquely identified by a subset of said characteristics.

6. The method of claim 5 wherein the step of entering data into said computer is performed automatically each time one of said elements is selected.

7. The method of claim 1 wherein said set of instructions includes a set of rules for connecting said plurality of fluid flow elements.

8. The method of claim 1 wherein said material handling system is selected from a set consisting of conveyor systems, baggage handling systems, automated guided vehicle systems, automated storage and retrieval systems, and newspaper handling systems.

9. A method for modeling a material handling system in three dimensions comprising the steps of:

providing at least one memory means;

storing in digital form in said at least one memory means a fluid flow object;

creating a material handling object as a subset of said fluid flow object;

storing in digital form in said at least one memory means a set of instructions for designing and displaying a model of a fluid flow network comprising a plurality of fluid flow elements defined in terms of said fluid flow object;

providing a computer operatively connected to said at least one memory means;

defining a plurality of material handling system elements in terms of said material handling object;

entering data into said computer including the identity of a first one of said plurality of material handling system elements;

entering data into said computer including the identity of a second one of said plurality of material handling system elements;

executing said set of instructions on said computer to display said first one of said plurality of elements connected to said second one of said plurality of elements.

10. A method for modeling a material handling system in three dimensions comprising the steps of:

providing at least one memory means;

storing in digital form in said at least one memory means a program for designing and displaying a model of a fluid flow network comprising interconnected fluid flow elements defined in terms of a hierarchy of characteristics;

defining a plurality of material handling system elements in terms of a plurality of characteristics;

arranging the material handling system characteristics of each of said plurality of elements into a hierarchy corresponding to said fluid flow element hierarchy;

storing said plurality of elements in a material handling system catalog;

storing said catalog in digital form in said at least one memory means;

providing a computer operatively connected to said at least one memory means;

inputting into said computer data describing a first element of said plurality of material handling system elements from said catalog;

inputting into said computer data describing a second element of said plurality of material handling system elements from said catalog;

running said program on said data to produce a display of said first element connected to said second element.

11. An apparatus for modeling a material handling system in three dimensions comprising:

at least one memory means;

a program stored in said at least one memory means for designing and displaying a model of a fluid flow network comprising interconnected fluid flow elements defined in terms of a hierarchy of characteristics;

a plurality of material handling system elements defined in terms of a plurality of characteristics, said characteristics being arranged into a hierarchy corresponding to said hierarchy of fluid flow element characteristics and stored in a catalog;

a computer operatively connected to said at least one memory means;

means for inputting into said computer data describing a first element of said plurality of material handling system elements from said catalog;

means for inputting into said computer data describing a second element of said plurality of material handling system elements from said catalog; and means for producing a display of said first element connected to said second element.

12. A method for modeling a material handling system comprising the steps of:

providing at least one memory means;

storing in digital form in said at least one memory means a set of instructions for designing and displaying a model of a fluid flow network comprising a plurality of fluid flow elements, each of said elements being defined by a first set of characteristics arranged in a first hierarchical structure;

creating a catalog of material handling system elements defined by a second set of characteristics;

arranging said second set of characteristics into a second hierarchical structure corresponding to a subset of said first hierarchical structure;

storing said catalog in digital form in said at least one memory means;

providing a computer operatively connected to said at least one memory means;

providing a display operatively connected to said computer;

identifying a first material handling system element from said catalog;

displaying a representation of said first element on said display;

identifying a second material handling system element from said catalog;

executing said set of instructions on said second element to display a representation of said second material handling system element connected to said first element.

13. The method of claim 12 wherein each of said first and second hierarchical structures comprises a plurality of levels for holding a plurality of characteristics.

14. The method of claim 13 wherein said first set of characteristics comprises a first number of elements and wherein said second set of characteristics comprises a second number of elements.

15. The method of claim 14 wherein said first number is greater than said second number.

16. The method of claim 14 wherein said first number is equal to said second number.

17. The method of claim 15 wherein said first number is less than said second number.

18. The method of claim 12 wherein said representation is a three-dimensional representation.

19. The method of claim 18 wherein said representations of said elements look similar to actual material handling system elements.

20. The method of claim 18 wherein said representations of said elements are volumetric.

21. The method of claim 12 wherein said representation is a two-dimensional representation.

22. The method of claim 12 wherein the step of identifying a first material handling element from said catalog comprises the additional steps of:

prompting a user to select an initial characteristic from a first level of said second hierarchical structure;

prompting the user to select at least one additional characteristic from said second hierarchical structure, wherein said additional selection is dependent on said initial selection.

23. The method of claim 22 wherein said initial characteristic is selected from the set consisting of conveyor systems, baggage handling systems, automated guided vehicle systems, automated storage and retrieval systems, and newspaper handling systems.

24. A method for modeling a material handling system in three dimensions comprising the steps of:

providing at least one memory means;

storing in digital form in said at least one memory means a set of instructions for designing and displaying a model of a fluid flow network comprising a plurality of fluid flow elements including a first set of rules for connecting said elements;

storing in digital form in said at least one memory means a catalog of material handling system elements;

providing a computer operatively connected to said at least one memory means;

selecting a first material handling system element from said catalog;

selecting a second material handling system element from said catalog;

entering data into said computer including the identity of said first and second selected elements;

executing said set of instructions on said data to display said first and second selected elements connected in accordance with said rules.

25. A method for constructing a layout of a material handling system using a digital computer and a digital computer modeling program for piping comprising the steps of:

inputting into a first database information pertaining to a plurality of material handling system elements, each material handling system element describing a discrete article moving component;

inputting into a second database information pertaining to a plurality of locations to be connected together to form the layout of the material handling system;

automatically designing a layout for the material handling system to connect said plurality of locations by running the digital computer modeling program for piping using the first and second database information.

26. A method for modeling a material handling system using a digital computer and a digital computer modeling program for piping comprising:

a) inputting data pertaining to discrete article material handling system elements into a database of said digital computer; and b) using the digital computer modeling program to:

i) prompt a user to select a first discrete article material handling system element from said database;

ii) prompt a user to select a second discrete article material handling system element from said database; and, iii) display said first element connected to said second element based on said prompts and running of the digital computer modeling program for piping.

27. The method of claim 26 wherein the elements in said database are arranged in a hierarchy.

28. The method of claim 27 wherein each of said elements in said database is defined in terms of a number of characteristics.

29. The method of claim 28 wherein the step of prompting a user to select a first element comprises the step of providing a list of characteristics of said first element.

30. The method of claim 28 wherein each of said elements is uniquely identified by a subset of said characteristics.

31. The method of claim 26 wherein said data includes a set of rules for connecting said plurality of elements.

32. The method of claim 26 wherein said material handling system is selected from a set consisting of conveyor systems, baggage handling systems, automated guided vehicle systems, automated storage and retrieval systems, and newspaper handling systems.

33. An apparatus for modeling a material handling system comprising:
- a) a computer having a memory storing a database, said database including descriptions of a plurality of discrete article material handling system elements, and a computer program for modeling piping systems, said computer including:
  - i) input means for allowing a user to select at least two of said plurality of discrete article material handling system elements; and
  - ii) means for assembling said at least two of said plurality of discrete article material handling system elements using the computer program for modeling piping systems; and
- b) display means for displaying said at least two assembled discrete article material handling system elements.

34. The method of claim 26, wherein said first element connected to said second element is displayed in two, three, or four dimensions.

35. The method of claim 25, further comprising inputting rules defining how the locations interconnect into a third database, the automatic designing step using the rules as a check to ensure that the plurality of locations are properly connected.

36. The method of claim 1, wherein the material handling system is a discrete article material handling system.

37. The method of claim 9, wherein the material handling system is a discrete article material handling system.

38. The method of claim 10, wherein the material handling system is a discrete article material handling system.

39. The apparatus of claim 11, wherein the material handling system is a discrete article material handling system.

40. The method of claim 12, wherein the material handling system is a discrete article material handling system.

41. The method of claim 24, wherein the material handling system is a discrete article material handling system.

42. The method of claim 1, wherein the material handling system element includes a component that defines a path of travel of the material being handled.

43. The method of claim 9, wherein the material handling system element includes a component that defines a path of travel of the material being handled.

44. The method of claim 10, wherein the material handling system element includes a component that defines a path of travel of the material being handled.

45. The apparatus of claim 11, wherein the material handling system element includes a component that defines a path of travel of the material being handled.

46. The method of claim 12, wherein the material handling system element includes a component that defines a path of travel of the material being handled.

47. The method of claim 24, wherein the material handling system element includes a component that defines a path of travel of the material being handled.

48. The method of claim 25, wherein at least one of the discrete article components defines a path of travel of the material being handled.

49. The method of claim 26, wherein the discrete article material handling system element includes a component that defines a path of travel of the material being handled.

50. The apparatus of claim 33, wherein the discrete article material handling system element includes a component that defines a path of travel of the material being handled.

* * * * *